United States Patent [19]  [11] 4,370,469
Deguchi et al.  [45] Jan. 25, 1983

[54] POLYPHENYLENESULFIDE SHEET-LIKE MATERIAL

[75] Inventors: Yukichi Deguchi, Ohtsu; Yukio Noguchi, Shiga; Hiroaki Kobayashi, Ohtsu, all of Japan

[73] Assignee: Toray Industries, Inc., Tokyo, Japan

[21] Appl. No.: 242,306

[22] Filed: Mar. 10, 1981

[51] Int. Cl.$^3$ .............................................. C08G 75/14
[52] U.S. Cl. .................... 528/388; 428/419; 428/901
[58] Field of Search ................. 528/388; 428/901, 419

[56] References Cited

U.S. PATENT DOCUMENTS

| | | | |
|---|---|---|---|
| 3,737,339 | 6/1973 | Alsberg et al. | 428/901 |
| 3,919,177 | 11/1975 | Campbell | 528/388 |
| 4,286,018 | 8/1981 | Asakura et al. | 528/388 |
| 4,301,274 | 11/1981 | Campbell | 528/388 |
| 4,313,995 | 2/1982 | Delgadillo | 428/901 |

*Primary Examiner*—Melvyn I. Marquis
*Attorney, Agent, or Firm*—Austin R. Miller

[57] ABSTRACT

A sheet-like material and a printed circuit board comprised of the sheet-like material with a metallic film laminated thereon are provided wherein the sheet-like material is comprised of a composition mainly consisting of high molecular weight poly p-phenylenesulfide, characterized in that:

a. the amount of related materials extracted through chloroform extraction of the poly p-phenylenesulfide containing related materials is less than 1.5 wt % of the entire weight of said poly p-phenylenesulfide prior to said extraction, and b. as measured by wide angle X-ray diffraction,
 (i) the index of crystallinity of said poly p-phenylenesulfide is in the range of above 2.5 and below 8.0,
 (ii) the crystallite size of said poly p-phenylenesulfide is in the range of above 50 Å and below 100 Å, and
 (iii) the orientation factors of said poly p-phenylenesulfide, measured in three directions comprising through the sample, edgewise and endwise, are above 0.70, as measured by wide angle x-ray diffraction.

11 Claims, No Drawings

POLYPHENYLENESULFIDE SHEET-LIKE MATERIAL

The present invention relates to a sheet-like material mainly consisting of poly p-phenylenesulfide and also to a printed circuit board or substrate employing said sheet-like material.

Conventionally, polyimide films have been used as raw materials for flexible printed circuit boards, owing to their superior thermal endurance. The polyimide films as described above, however, have drawbacks in that they are not only extremely expensive, but also generally have weak resistance to strong alkalis such as aqueous sodium hydroxide and the like, which are used in manufacturing printed circuit boards. Also, they have high moisture absorbance, thus suffering dimensional changes when exposed to humidity variations.

On the other hand, poly p-phenylenesulfide, when formed int a sheet-like configuration, has low moisture absorbance, exhibits superior performance in insulating resistance, thermal endurance, resistance to chemicals, etc., and is useful as a raw material for printed circuit boards such as flexible circuit boards or carrier tapes for IC chips. An unstretched poly p-phenylenesulfide film produced by heating and crystallizing substantially unoriented films is particularly easy to manufacture. Further, it has essentially no residual strain resulting from stretching, and is without any significant dimensional variation due to heat shrinkage, even when subjected to a high temperature atmosphere. Therefore it is considered to be highly advantageous as a substrate for printed circuit boards.

However, conventional unstretched poly p-phenylenesulfide film has many disadvantages, and cannot successfully be applied to end uses requiring long term flexibility or to uses where boring is required in the manufacturing process, and thus is extremely limited in the range of applications under present circumstances.

More specifically, one disadvantage of known unstretched poly p-phenylenesulfide film resides in its lack of flexibility as represented by folding endurance. This is not sufficient even immediately after manufacturing, and is further reduced to a considerable extent as time elapses.

Further, since conventional unstretched poly p-phenylenesulfide films are fragile and weak upon impact, cracks tend to form around the peripheries of bores or holes, and the films tend to break at such cracks, especially when the poly p-phenylenesulfide film is subjected to punching or drilling.

Accordingly, it is a primary object of the present invention to provide an improved unstretched poly p-phenylenesulfide sheet-like material which has superior flexibility and impact strength, with substantial elimination of the disadvantages inherent in conventional unstretched poly p-phenylenesulfide films.

Another object of the present invention is to provide an improved printed circuit board having excellent flexibility for long periods and also superior properties after having been subjected to boring, punching, drilling and the like, and which utilizes an improved unstretched poly p-phenylenesulfide sheet of the above-described type.

In accomplishing these and other objects, according to one preferred embodiment of the present invention, there is provided a sheet-like material comprising a composition mainly consisting of high molecular weight poly p-phenylenesulfide, characterized in that:

a. the amount of ingredient which is extracted through chloroform extraction of said sheet-like material is less than 1.5 wt% of the entire weight of said sheet-like material prior to said extraction, and b.
(i) the index of crystallinity of said poly p-phenylenesulfide is in the range of above 2.5 and below 8.0
(ii) the crystallite size of said poly p-phenylenesulfide is in the range of above 50 A and below 100 A, and
(iii) the orientation factors of said poly p-phenylenesulfide, measured in three directions comprising through the sample, edgewise and endwise, are above 0.70, as measured by wide angle X-ray diffraction.

According to the present invention, an improved printed circuit board is also provided. It comprises the improved poly p-phenylenesulfide sheet-like material as described above, with a metallic thin film or layer laminated thereon.

The high molecular weight poly p-phenylenesulfide employed in the practice of the present invention is based upon recurring units as represented by the structural formula

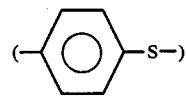

which is present in an amount of more than about 90 mole %, preferably more than about 95 mole %. If such para-oriented phenylenesulfide unit is present in an amount of less than about 90 mole %, the crystallinity of the polymer is not sufficient and it is difficult to obtain a superior film due to poor thermal endurance during soldering, etc.

With respect to the remaining recurring units of said polymer present in an amount of less than about 10 mole %, these may be meta-oriented units

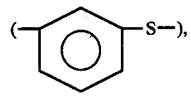

ether units

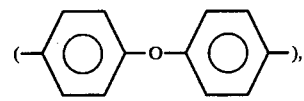

sulfane units

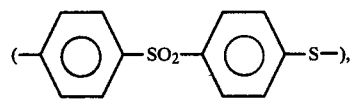

biphenyl units

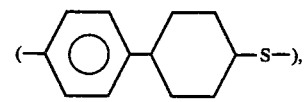

naphthalene sulfide units

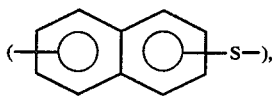

displaced phenyl sulfide units

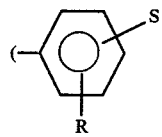

where R represents alkyl, nitro, phenyl or alkoxide), tri-functional phenyl sulfide units

etc., or compatible mixtures of any of the foregoing. The content of such other components must be such as not to harm the crystallinity, stretchability and orientation efficiency of the polymer. It is preferred that the content of comonomers of poly p-phenylenesulfide should be less than about 5 mole %. Particularly, it is preferable that multi-functional comonomers having more than three functions should be present in molar amounts less than 1%.

Additionally, the apparent melt viscosity of the polymer should be in the range between 2000 and 100,000 poises, preferably between 3000 and 50,000 poises at 300° C. and at a shear rate of 200 seconds$^{-1}$. It is further preferred that the non-Newtonian coefficient (referred to as the N value hereinbelow) under the above-stated conditions should be in the range of about 0.9 to 2.0. Polymers with considerably higher or lower viscosities are not only inferior from the viewpoints of uniformity during extrusion, surface condition of film, etc., but present serious difficulties during the biaxial operation. When the content of crosslinking or branching chains is high, with the N value exceeding 2.0, efficiency of orientation, thickness variation and surface roughness, etc. through stretching are adversely affected.

Although there is no direct relationship between the apparent melt viscosity and the N value, and the so-called "melt flow index" generally employed as an index for melting viscosity of resins, the melt flow index of the poly p-phenylenesulfide which may be used in the present invention is in the range of about 10 to 130.

On the other hand, exact values for the degree of polymerization are not available, since measurements are difficult to take due to the insolubility of poly p-phenylenesulfide in the usual organic solvents at normal temperature. Marked differences are observed depending on the compositions of the comonomers present and the degrees of crosslinking, etc., in such comonomers. However, values for the degree of polymerization are about 50 to 1000.

Addition of substances such as anti-oxidants, thermostabilizers, lubricants, nucleation agents, ultra-violet absorbers, colorants, etc. to the poly p-phenylenesulfide employed in the present invention, to the extent normally accepted, causes no particular problems. Moreover, blending or mixing of small amounts of other polymers and fillers with the poly p-phenylenesulfide of the present invention, in amounts which do not hinder the functions of the poly p-phenylenesulfide, sometimes serve for improvement of fluidity, fine adjustment of crystallinity and the like.

However, in cases where the sheet according to the present invention is to be used as an electrical insulating material, extra care should be taken in the preparation of the poly p-phenylenesulfide resin and in selection of additives so as to avoid reduction of insulation resistance. Although the poly p-phenylenesulfide itself possesses extremely favorable electrical insulation resistance in conditions over a wide range from low temperatures to high temperatures, such electrical resistance is undesirably decreased to a marked extent if any conductive substance (for example, metallic ion or the like) is present. Accordingly, it is essential in the preparation of the polymers to carefully remove conductive substances such as metallic ions, etc., and simultaneously, not to cause such substances to be added.

In the sheet-like material of the present invention, it is required that the amount of extract when extracted by chloroform under conditions as stated later, is less than 1.5 wt% (preferably, less than 1.2 wt%) of the entire weight of the poly p-phenylenesulfide before extraction. Sheet-like material having an extraction amount exceeding 1.5 wt% is poor in flexibility and impact strength, and these properties deteriorate markedly as time elapses.

Although it is not clear why poly p-phenylenesulfide sheets having high extraction amounts as described above are inferior in flexibility and impact strength, this may be attributable to the fact that, in the amorphous region of the heated and crystallized sheet to support the flexibility and impact strength, crystallites are formed of the low molecular weight compositions which are extractable by chloroform, thus resulting in loss of such flexibility and impact strength.

The crystalline structure of the sheet-like material according to the present invention is characterized by the following three sets of parameters as measured by wide angle X-ray diffraction.

The index of crystallinity must be in the range above about 2.5 and below about 8.0 (more preferably, above 3.0 and below 6.0). The index of crystallinity as referred to above may be defined by the ratio ($I_{200}/I_{25}$) of (a) the maximum intensity ($I_{200}$) of the diffraction peak with a Miller index of (200) of the poly p-phenylenesulfide crystal in the wide angle X-ray diffraction profile of the sheet, to (b) the intensity ($I_{25}$) at $2\theta = 25°$ at the same profile. If the index of crystallinity as described above is less than about 2.5, the mechanical strength in a high temperature atmosphere, such as a solder bath, is low, with poor thermal endurance. When the index of crystallinity exceeds about 8.0, the resultant sheet becomes brittle or fragile, with loss of flexibility and impact strength.

The sizes of poly p-phenylenesulfide crystallites within the sheet (referred to as ACS hereinbelow) must be in the region above about 50 Å and below about 100 Å. The size of the crystallite referred to above means the apparent size of the crystallite obtained by applying Scheller's formula to the half width of the diffraction peak with a Miller index of (200) of the poly p-phenylenesulfide crystal. If the ACS is less than about 50 Å, poor thermal endurance may result, while any sheet having an ACS value exceeding about 100 Å is difficult to obtain.

It is also required that the orientation factors of the poly p-phenylenesulfide as measured in three directions comprising through the sample, edgewise and endwise must respectively be above 0.70. The orientation factor as measured in a certain direction as referred to above, is defined by the ratio $I\phi = 30°/I\phi = 0°$ of photo density $(I\phi = 0°)$ obtained by such procedures as taking X-ray plate image by the Laue method through the X-ray incidence in said certain direction and scanning (200) the diffraction ring of the poly p-phenylenesulfide crystal by a microphotodensitometer in the radial direction along the equatorial line, with respect to the photo density $(I\phi = 0°)$ obtained in a similar manner but in a direction of 30°.

The "through" direction referred to above is the direction perpendicular to the sheet surface, the "edge" direction is the direction parallel to the sheet surface and in the transverse direction of said sheet, and the "end" direction is the direction parallel to the sheet surface and in the longitudinal direction of said sheet. If the value of orientation factor as described above is less than 0.7, heat shrinkage is likely to take place due to residual strain following stretching.

The method of manufacturing the sheet according to the present invention will be explained hereinbelow.

The poly p-phenylenesulfide polymer to be employed for the production of the sheet-like material according to the present invention may be obtained by causing alkali metal sulfide to react with para-dihalobenzene in polar organic solvents under high temperature and high pressure. Particularly, it is preferable to cause sodium sulfide to react with p-dichlorobenzene in an amide type high boiling point polar organic solvent such as N-methyl-pyrrolidone, etc. In the above case it is most desirable to effect the reaction at a temperature of 230° C. to 280° C. through addition of a so-called polymerization modifier such as caustic alkali metal carboxylate for adjustment of the degree of polymerization. The pressure in the autoclave and time for polymerization may be suitably determined according to the kinds and amounts of modifiers to be employed and the desired degree of polymerization, etc. For maintaining good electrical insulation performance of the film to be finally obtained, it is desirable to wash the polymerized polymer (generally in the form of powder) with water which does not contain metallic ions, to remove by-product salts, polymerization modifiers, etc., thereby keeping the ionic carrier concentration sufficiently small. In the above case, the total ash in the polymer should preferably be less than 5000 ppm, with calcium content being less than 1000 ppm and sodium content less than 500 ppm.

The poly p-phenylenesulfide polymer thus obtained is fed to melt extrusion equipment such as a conventional extruder and is formed into a sheet-like configuration.

However, where a large amount of material which is extractable by chloroform is contained in the polymer and the extraction amount with respect to the sheet-like material does not fall in the range as defined by the present invention, the sheet-like material is poor in flexibility and impact strength.

Where this occurs, it is desirable to preliminarily treat the polymer before delivering it to the forming process. For this purpose, for example, the polymer powder obtained by polymerization and washing with water is further washed or rinsed in a suitable organic solvent maintained at a temperature higher than room temperature (preferably higher than 50° C.) under normal or increased pressure. The organic solvents employable in the above treatment may, for example, be methylene chloride, N-methyl-2-pyrrolidone, chloroform, toluene, etc. Similarly, acetone heated to a temperature near its boiling point may also be employed.

During formation of poly p-phenylenesulfide polymer into a sheet-like configuration by the use of melt extrusion equipment, the poly p-phenylenesulfide in the melted state is subject to gelation through contact with oxygen. Therefore it is desirable to flood the interior of the hopper of the extruder, etc. with inert gas, or to reduce the pressure therein.

The melted resin is continuously extruded from slit-shaped dies (for example, T dies, circular dies, etc.) so as to be forcibly cooled. To effect such forcible cooling, one may resort to casting onto a cooled metallic drum, spraying gas or liquid at low temperatures, or immersing in a liquid at low temperature or the like, individually or in combination. The forcible cooling as described above causes, the melted poly p-phenylenesulfide to be rapidly cooled to a temperature below the glass transition temperature of the poly p-phenylenesulfide, thus forming it into a sheet in the unoriented and amorphous state. Prior to or during the cooling step, the sheet may be easily stretched in the longitudinal direction or transverse direction, or in both directions. This is preferable from the viewpoints of flexibility and impact strength, as long as the orientation factor of the sheet finally obtained is limited to a value above about 0.70. However, in general, such stretching should be effected with the temperature of the sheet higher than 220° to 230° C. As one example, immediately after the extrusion of poly p-phenylenesulfide from a circular die, it may be stretched 3 to 10 times with respect to the area through utilization of air pressure (the so-called blowup method).

In the manner as described above, the formed material in the configuration of a sheet as an intermediate product is obtained. The expression "sheet-like material" according to the present invention broadly means a thin-leaf like formed material which is less than approximately 5 mm in thickness, and this term generally encompasses formed items normally called films, sheets, plates, etc.

Subsequently, constant dimensional heat set is effected for the purpose of improving thermal endurance. The expression "constant dimensional heat set" according to the present invention means heat treatment under such conditions that dimensional variation before and after the heat treatment becomes below ±20%.

Heat treatment as described above is effected by bringing the sheet to be treated into contact with the flow of heated liquid or gas or with surface of a solid. (The "temperature" and "time" for the heat treatment to be mentioned later indicate the temperature and contact time with such heating medium.) More specifically, examples of such heat treatment include bringing the poly p-phenylenesulfide into contact with a heated roll (the "roll heat treating method"), employing a tenter, blasting heated air flow on a roll, etc.

The temperatures for the above heat treatment are between above 150° C. and below 280° C. Temperatures below 150° C. are not preferable, since there is a possibility that the ACS of the sheet to be obtained will go below 50 Å. On the other hand, if the temperature exceeds 280° C., it becomes difficult to effect the heat treatment by the methods earlier described, since the sheet-like material tends to lose its shape due to softening.

Although the time for the heat treatment is one of the main factors for determining the index of crystallinity, the index may also vary according to the properties of the polymer employed, and the methods and times used for the heat treatment. Therefore, the parameters must be adjusted so that the index of crystallinity of the material falls into the required range.

In order to produce a printed circuit board according to the present invention, it is the general practice to apply a metallic foil such as a copper foil onto the poly p-phenylenesulfide sheet-like material through employment of a suitable adhesive, or to form a metallic layer on the surface of the sheet by plating or vacuum metallizing, etc. Alternatively, a laminated material of poly p-phenylenesulfide and metallic foil may be produced either by applying poly p-phenylenesulfide onto the metallic foil by extrusion laminating or by fusing together the poly p-phenylenesulfide sheet and the metallic foil by heat pressing, and thereafter subjecting the product to heat treatment for crystallization of the poly p-phenylenesulfide.

As a result of the construction of the sheet-like material of the present invention as described above, the flexibility, impact strength and aptitude for boring are remarkably improved. Thus, an improved sheet-like material with extremely high reliability has been advantageously created. It can be incorporated, for example, into a printed circuit board utilizing boring and bending or folding procedures.

Furthermore, the printed circuit board according to the present invention has superior high frequency electric characteristics as well as excellent resistance to chemicals and moisture. It has excellent flexibility, aptitude for boring and thermal endurance, and in a printed circuit board its properties are well balanced to produce an advantageous product not heretofore realized.

In the description which follows, details will be given on the characteristic values of the polymer and sheet-like material employed in the present invention, and also on the measurement and evaluation thereof.

(1) Extraction by chloroform

Approximately 10 g of a sample cut into square pieces each about 1 cm length and width are accurately weighed on a chemical balance, and the weight is represented by Ag.

Subsequently, the sample is set in a Soxhlet extractor containing about 100 cc of chloroform for extraction by a hot water bath of 65° C. for 24 hours.

Thereafter, the extracted liquid is transferred into a weighing bottle (the weight thereof is represented by Bg) accurately weighed in advance, with further addition thereto of a primary washing liquid obtained by washing the interior of the extractor with a small amount of chloroform for subsequent drying in a hot air oven at a temperature of 30° C. until the liquid disappears. In the next step, after transfer into the hot air oven at 65° C. and drying for one hour, the sample is cooled down to room temperature in a desiccator containing silica gel and subsequently, is accurately weighed by a chemical balance (this weight is represented by Cg).

The results thus obtained are applied to the following equation so as to obtain the amount of extraction Wex (wt%).

$$Wex = 100(C-B)/A$$

(2) Wide angle X-ray diffraction method

Orientation factor: With each of the samples being aligned in the stretching direction and formed (for fixing each film during the formation, 5% amyl acetate solution of collodion is employed) into a strip 1 mm thick, 1 mm wide and 10 mm long, X-rays were directed so as to be incident along the surface of the film (in the Edge and End directions) and perpendicular to the surface (in the through direction) for taking X-ray plate image photographs. For the X-ray generating apparatus, a Model D-3F unit made by Rigaku Denki was employed, with Cu-K$\alpha$ rays passed through an Ni filter at 40 kV–20 mA being employed as the X-ray source. The distance between the sample and film was set at 41 mm, and multi-exposure method (15 inchs. and 30 mins.) was adopted by the use of Kodak non-screen type films.

In the next step, the orientation degree of each sample was defined $$OF = I_{\phi=30°}/I_{\phi=0°}$$

by reading the photo density of the diffraction peak with a Miller index of (200) on the X-ray plate image photograph, through scanning by a densitometer in a radial direction from the center of the plate image at positions of $\phi=0°$ (on the equatorial line) 10°, 20° and 30°, wherein $I\phi=30°$ shows the maximum intensity of scanning at 30° and $I\phi=0°$ represents the maximum intensity at scanning of the equatorial line. It is to be noted here that the average values of strength of $\phi=0°$ and $\phi=180°$ were employed for $I\phi=0°$, and those of strength of $\phi=30°$ and $\phi=150°$, for $I\phi=30°$.

In connection with the above, the measurement conditions of the densitometer are as follows.

The apparatus included a Sakura micro-densitometer Model PDM-5 type A made by Konishiroku Photo Industry Co. with the measurement density range of 0.0~4.0 D (minimum measuring area $4\mu^2$ conversion), optical magnifications of 100 times, slit width of $1\mu$, and height of $100\mu$, while the film movement speed was 50 $\mu$/sec. at a chart speed of 1 mm/sec.

ACS and index of crystallinity: For cancelling the orientation effect of the sample, rotation of the sample in a plane was adopted and the diffraction pattern was measured by the refraction method. The X-ray generating apparatus was a Model D-8C unit made by Rigaku Denki, while Cu-K$\alpha$ passed through an Ni filter at 35 kV-15 mA was employed as the X-ray source. For the goniometer, Model PMG-A2 unit made by Rigaku Denki was employed, and the sample was mounted on a rotary sample table rotatable at a speed of 80 rpm, with a divergence slit 1°, a receiving slit 0.15 mm and scattering slit 1° being employed for the slit system. The 2$\theta$ scanning speed was 1°/min., while the chart speed was 1 cm/min. Each of the samples was cut into a square having one side of 20 mm, and was piled up into thickness of 0.5 mm for preparing the measurement specimen.

From the half width of the diffraction peak with a Miller index of (200), the apparent crystal size was worked out by the employment of Scheller's formula:

$$ACS(A) = K\lambda/\beta \cos\theta, \quad \beta = [B^2 - (B')^2]^{\frac{1}{2}}$$

Where
K is Scheller constant (K=1)
$\lambda$ is X-ray wave length ($\lambda - 1.5418$ A)
$2\theta$ is Bragg angle (°)
$\beta$ is half width after correction (radian)
B is actually measured half width, and
B' is half width of correcting standard sample (Si single crystal)

Meanwhile, with respect to the index of crystallinity from the diffraction profile of each sample, the maximum intensity ($I_{200}$) at the diffraction peak with a Miller index of (200) and an intensity ($I_{25}$) at $2\theta = 25°$ as internal standard were measured with the ratio thereof being defined as the index of crystallinity ($I_{200}/I_{25}$).

(3) Apparent melt viscosity ($\mu_0$) and non-Newtonian coefficient (N).

With the use of an extrusion plastometer type viscometer having a capillary shaped die of length L and radius R, when the output by volume, upon extrusion of the polymer under pressure of P and at temperature T, is represented by Q, the apparent shear stress $\tau$, apparent shear rate $\dot{\gamma}$ and apparent viscosity $\mu$ are defined as follows.

$\tau = (RP)/(2L)$
$\dot{\gamma} = (4Q)/(\pi R^2)$
$\mu = \tau/\dot{\gamma}$

In the above case, the apparent melt viscosity $\mu_0$ is defined by the value at $\dot{\gamma} = 200(\text{sec.})^{-1}$, of a curve $\mu = f(\gamma)$ to be obtained through plotting of $\mu$ at the time with respect to various $\gamma$.

On the other hand, the non-Newtonian coefficient N is defined by the reciprocal of the value at $\dot{\gamma} = 200(\text{sec.})^{-1}$ of $$d \log g(\dot{\gamma})/d \log \dot{\gamma}$$

which is the full logarithmic differential function of a curve $\tau = g(\dot{\gamma})$ to be obtained by plotting $\tau$ with respect to various $\dot{\gamma}$. The value N as described above is equal to the index n, on the assumption that the relation between the shear stress S and shear rate D of the melt polymer (the so-called flow curve) may be approximated by the formula $D = aS^n$ (a and n are constants).

In the present invention, the value measured at T = 300° C. was adopted with the employment of a die of L = 10 mm and R = 0.5 mm.

(4) Glass transition temperature (Tg) and melting point (Tm)

These were measured by the DSC method, while Tm was defined by the peak temperature of the melting curve.

(5) Tensile strength, elongation

According to the method set forth in JIS z 1702, measurements were taken by the employment of a tensile tester of the "Instron" type.

(6) Heat shrinkage

A. The sample films were cut into ribbon-like shapes, each film measuring 10 mm in width and 250 mm in length.

B. Two marked lines were drawn in the transverse direction in parallel relation to each other at an interval of about 200 mm, and the intervals between the marked lines were accurately measured with the use of a casedometer (Amm).

C. The above samples were placed into the hot air oven at 250° C., with a load of 1 g being applied to the forward end of said sample. The samples were removed after standing in the oven for 10 minutes.

D. The interval between the two marked lines was measured again with the use of the casedometer (Bmm).

E. The heat shrinkage (%) was defined as 100 (A-B)/A.

(7) Folding endurance

The number of folding endurance at 20° C. was measured according to the method set forth in JIS P-8115 (the so-called MIT method).

(8) Rate of defects in boring process

A. In the case of a sheet: With the sheet cut into the shape of a tape 35 mm in width and 10 m in length, sprocket perforations of carrier tape for IC chips were formed at opposite sides of the tape by employing a punching machine for the carrier tapes for IC chips. Thereafter, by counting the number of perforations formed with cracks at the peripheral edges thereof through visual examination, the rate of defects in the boring process was defined by the rate of occurence with respect to the total number of perforations.

B. In the case of a printed circuit board substrate: By using a drill 1 mm in diameter, 1000 holes or bores were formed in the substrate from the metallic foil side thereof in a checkerboard-like pattern at intervals of 10 mm, and thereafter, the number of holes having cracks at their peripheral edges was counted through visual examination so as to define the frequency of occurence of defects in the boring process with respect to the total number of holes.

(9) Solderability

A. In the case of a sheet: The film, cut into squares each 50 mm in length and width, was floated on a solder bath kept at a temperature of 250° C. for observation of dimensional stability at this time. Thereafter, a tension of approximately 0.5 kg/mm² was applied to the opposite edges of the film in the solder bath for visual examination of the degree of elongation at that time.

The results of the evaluation were represented by the following four grades:

O: Dimensional stability was favorable, with almost no elongation.

⚠: Although favorable in dimensional stability, elongation was large.

⚠: Elongation was small, but the product was poor in dimensional stability.

X: Poor in dimensional stability, with large elongation.

B. In the case of a printed circuit board substrate:

The evaluation was effected according to the method set forth in JIS C-6481, and swelling and peeling on the film surface and copper foil surface were visually examined.

The results of the evaluation were represented by the following gradings:

O: Neither swelling nor peeling was observed.

X: Both swelling and peeling were observed.

(10) Resistance to chemicals

The evaluation was effected according to the method set forth in TEST METHODS MANUAL No. 2, 3, 2 of the IPC (Institute of Printed Circuits), and indications were made as follows according to the residual or retention rate of peeling strength.

O: Residual Rate More than 80% inclusive

X: Residual rate Less than 80%

The following Examples are provided for the purpose of explaining the present invention in greater detail, without any intention of limiting the scope thereof.

EXAMPLE 1

(1) Polymerization of poly p-phenylenesulfide

A. Polymerization of high molecular weight poly p-phenylenesulfide (polymer "A") employed in the present invention. 32.6 kg of sodium sulfide (250 mol, containing water of crystallization at 40 wt%), 100 g of sodium hydroxide, 18.0 kg (125 mol) of sodium benzoate, and 79.2 kg of N-methyl-2-pyrrolidone were placed into an autoclave, and gradually heated to 250° C., while stirring to remove the distillant liquid of 7.0 l containing water of 6.9 kg. Subsequently, 37.5 kg (255 mol) of 1, 4-dichlorobenzene (referred to as DCB hereinbelow) and 20.0 kg of N-methyl-2-pyrrolidone were added to the remaining mixture for heating at 250° C. for 3 hours. The reaction product was subjected to extraction in methylene chloride at 38° C. for 2 hours, with further 8 times washing in hot water, and then, dried at 80° C. for 24 hours by using a vacuum dryer, and thus, 21.9 kg of high molecular weight poly p-phenylenesulfide (yield 81%) with apparent melt viscosity of 4200 Poises, N value of 1.6, Tg of 91° C. and Tm of 280° C. was obtained.

B. Polymerization of poly p-phenylenesulfide (polymer "B") for comparison. In similar procedures as described above, polymerization was effected for 5 hours at 265° C. for a further 8 times washing with hot water without performing any methylene chloride extraction, and subsequent drying, and thus, approximately 20 kg of dried poly p-phenylenesulfide having an apparent melt viscosity of 3500 Poises, an N value of 1.6, a Tg of 88° C., and a Tm of 279° C. was obtained.

(2) Thermoforming

Polymers "A" and "B" of poly p-phenylenesulfide obtained by the processes as described in the foregoing were each fed to an extruder of 40 mm$\phi$ and melted at a temperature of 310° C., and then extruded from a T shaped die having a linear lip 600 mm in length and 0.2 mm in clearance so as to be cast onto a metallic drum kept at a surface temperature of 65° C. for cooling and solidification, and thus, amorphous films A-1 and B-1 of 550 mm in width and 50 μm in thickness were obtained (cast method). Meanwhile, previously prepared polymers "A" and "B" of poly p-phenylenesulfide were each supplied to an extruder of 38 mm in diameter for melting at a temperature of 310° C., and were then extruded from a circular die 50 mm in diameter and 0.5 mm in clearance. Immediately thereafter, air was directed into the melted film tube for blowing 10 times in area with subsequent rapid cooling by the air stream, and thus amorphous films A-2 and B-2 which were 250 mm in width and 50 μm in thickness were obtained (tubular method).

(3) Heat treatment

The amorphous films A-1, A-2, B-1 and B-2 were each subjected to heat treatment with the use of of a tenter at 260° C. for 30 seconds, and thus films A-1-1, A-2-1, B-1-1 and B-2-1 were obtained.

(4) Properties of the films obtained

Table-1 shows the properties of the films obtained. More specifically, films A-1-1 and A-2-1 are those according to the present invention, while films B-1-1 and B-2-1 are not.

TABLE 1

| Film designation | Poly p-phenylene-sulfide employed | Chloroform extracted amount (wt %) | Orientation Factor | | | ACS (Å) | Index of crystallinity |
| --- | --- | --- | --- | --- | --- | --- | --- |
| | | | Through | End | Edge | | |
| A-1-1 | A | 0.71 | 0.89 | 0.94 | 0.91 | 72 | 5.1 |
| A-2-1 | A | 0.69 | 0.95 | 0.80 | 0.79 | 70 | 5.4 |
| B-1-1 | B | 1.98 | 0.90 | 0.96 | 0.89 | 73 | 5.5 |
| B-2-1 | B | 1.95 | 0.96 | 0.81 | 0.82 | 74 | 5.7 |

(5) Evaluation

Table-2 shows the results of evaluation of the above-described films.

As is clear from Table-2, the films according to the present invention are superior not only in mechanical properties and dimensional stability at high temperatures, but also in flexibility and adaptability to boring, drilling, shaping and punching, which is a drawback of conventional films, while having less deterioration in flexibility and adaptability for boring with time. On the other hand, the known films having a high chloroform extractable content are poor in flexibility and in adaptability for boring, punching, etc.

TABLE 2

| Evaluation results | | Sample film | | | |
| --- | --- | --- | --- | --- | --- |
| | | A-1-1 | A-2-1 | B-1-1 | B-2-1 |
| Tensile strength (kg/mm$^2$) (MD) | | 8.0 | 8.5 | 7.8 | 8.1 |
| Elongation (%) (MD) | | 7.4 | 7.1 | 6.5 | 6.6 |
| Heat shrinkage (%) (MD) | | 0.4 | 0.5 | 0.5 | 0.5 |
| Folding endurance (times) | Immediately after manufacture | 5200 | 6500 | 900 | 1300 |
| | 100° C., after 30 days | 3600 | 4300 | 440 | 670 |
| Frequency of defects in boring (%) (punching) | Immediately after manufacture | 0 | 0 | 1.3 | 0.9 |
| | 100° C., after 30 days | 0 | 0 | 1.7 | 1.5 |
| Remarks | | Present invention | Present invention | Comparative item | Comparative item |

EXAMPLE 2

(1) Amorphous film

The amorphous film A-1 used in EXAMPLE 1 was employed.

(2) Heat treatment

The amorphous film A-1 was subjected to heat treatments at various temperatures for different periods of time with the use of the tenter. Thus, films A-1-1 through A-1-5 having different indices of crystallinity and ACS were obtained.

(3) Properties and evaluation results of the films obtained

Table-3 shows the properties and evaluation results of the resulting films.

Table-3 shows that even if the chloroform extractable content is low, films with superior properties are difficult to obtain if the three sets of parameters determined by wide angle X-ray diffraction are not within the specific ranges of this invention.

TABLE 3

| Item | Unit | A-1-1 | A-1-2 | A-1-3 | A-1-4 | A-1-5 |
|---|---|---|---|---|---|---|
| Heat treating temperature | °C. | 260 | 260 | 277 | 130 | 270 |
| Heat treating time | Second | 30 | 2 | 3600 | 30 | 60 |
| Chloroform extraction amount | wt % | 0.71 | 1.1 | 0.62 | 1.0 | 0.69 |
| *OF Through | | 0.89 | 0.87 | 0.85 | 0.95 | 0.87 |
| End | | 0.94 | 0.96 | 0.98 | 1.00 | 0.96 |
| Edge | | 0.91 | 0.88 | 0.84 | 0.97 | 0.90 |
| **ACS | Å | 72 | 69 | 80 | 45 | 75 |
| Index of crystallinity | | 5.1 | 2.0 | 8.5 | 2.5 | 5.3 |
| Heat shrinkage rate | | 0.4 | 0.8 | 0.3 | 0.7 | 0.4 |
| Folding endurance (immediately after manufacture) | | 5200 | 8300 | 240 | 2600 | 4900 |
| Solderability (o = good to excellent) (x = fair to poor) | | o | x | o | x | o |
| Remarks | | Present invention | Comparative item | Comparative item | Comparative item | Comparative item |

*OF = Orientation factor
**ACS = Sizes of poly p-phenylenesulfide crystallites within the sheet

EXAMPLE 3

(1) Raw material

Poly p-phenylenesulfide-A used in EXAMPLE 1 was employed.

(2) Thermoforming

Poly p-phenylenesulfide-A was formed by the tubular method referred to in item (2) of EXAMPLE 1. In the above case, three different dies were prepared by making the slit clearances of circular dies respectively into 0.4 mm, 0.8 mm and 2.5 mm. They were employed, through blowing 8 times, 16 times and 50 times in the respective areas, and thus, three different films (A-3, A-4, and A-5), each 50 μm in thickness, were obtained.

(3) Heat treatment

Amorphous films A-3, A-4 and A-5 were respectively subjected to heat treatments with the use of the tenter at 270° C. for 120 seconds, and thus, films A-3-1, A-4-1 and A-5-1 were obtained.

(4) Properties and evaluation results of the films obtained

Table-4 shows the properties and evaluation results of the resulting films.

In Table-4, it is indicated that in the films with low values of orientation factor, heat shrinkage is increased by reason of the residual strain due to orientation, and thus their superior features as unstretched films are lost.

TABLE 4

| | Sample film | | |
|---|---|---|---|
| Items | A-3-1 | A-4-1 | A-5-1 |
| Chloroform extraction amount (wt %) | 0.73 | 0.71 | 0.70 |
| *OF Through | 0.89 | 0.93 | 0.92 |
| End | 0.86 | 0.76 | 0.61 |
| Edge | 0.85 | 0.75 | 0.59 |
| **ACS | 76 | 75 | 72 |
| Index of crystallinity | 5.2 | 5.9 | 7.0 |
| Heat shrinkage rate (%) | 0.3 | 0.5 | 1.6 |
| Folding endurance (times) | 6000 | 6100 | 4600 |
| Solderability (o = good to excellent; x = fair to poor) | o | o | o |
| Remarks | Present invention | Present invention | Comparative item |

*OF = Orientation factor
**ACS = Sizes of poly p-phenylenesulfide crystallites within the sheet

EXAMPLE 4

(1) Base film

A poly p-phenylenesulfide film (A-1-1) according to the present invention and a comparative film (B-1-1) used in EXAMPLE 1 were employed.

(2) Preparation of a printed circuit board substrate a. The base film was subjected to electrical corona treatment by applying electrical energy of 3000 joules per square meter of film.

b. Subsequently, an adhesive mainly composed of dimer acid group polyamide ("Milbex 1200") was coated into a thickness of 20 μm (after drying) with the use of a reverse coater.

c. In the next step, with an electrolytic polished Cu foil (35 μm in thickness) of the type useful for printed circuit board substrates being placed thereon, the film was passed through a press roll having a linear pressure of 3 kg/cm, and was maintained at a temperature of 100° C. for lamination.

d. The laminated material thus obtained was exposed to hot air in an oven at 80° C. for 4 days so as to harden the adhesive. A substrate for a printed circuit board was thus obtained.

(3) Results of evaluation

Table-5 shows the results of this evaluation.

Table-5 shows that, in the printed circuit substrate according to the present invention, the adaptability for boring, as contrasted to the drawbacks of conventional substrates employing known poly p-phenylenesulfide unstretched films, has been sharply improved, while the superior resistance to chemicals and thermal endurance specific to the substrates using poly p-phenylenesulfide films are well maintained.

TABLE 5

| Evaluation item | Base film | |
| --- | --- | --- |
| | A-1-1 | B-1-1 |
| Frequency of defects in boring process (%) (drilling) | 0 | 2.1 |
| Resistance to chemical (o = good to excellent) | | |
| Alcohol | o | o |
| Hydrocarbon | o | o |
| Ketone | o | o |
| Chlorinated Solvent | o | o |
| Acids | o | o |
| Base | o | o |
| Solderability (o = good to excellent) | o | o |

What is claimed is:

1. A sheet-like material comprising a composition mainly consisting of high molecular weight poly p-phenylenesulfide, characterized in that:
   a. the amount of ingredient which is extracted through chloroform extraction of said sheet-like material is less than 1.5 wt% of the entire weight of said sheet-like material prior to said extraction, and
   b.
   (i) the index of crystallinity of said poly-p-phenylenesulfide is in the range of about 2.5 and below 8.0,
   (ii) the crystallite size of said poly p-phenylenesulfide is in the range of about 50 Å and below 100 Å, and
   (iii) the orientation factors of said poly p-phenylenesulfide, measured in three directions comprising through the sample, edgewise and endwise, are above 0.70, as measured by wide angle X-ray diffraction.

2. A printed circuit board which comprises a poly p-phenylenesulfide sheet-like material as claimed in claim 1 with a metallic thin film laminated thereon.

3. The sheet-like material as claimed in claim 1 wherein said high molecular weight poly p-phenylene sulfide is based upon recurring units as represented by the structural formula

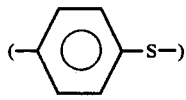

in an amount of more than about 90 mol percent.

4. The sheet-like material as claimed in claim 1 wherein said high molecular weight poly p-phenylenesulfide is based upon recurring units as represented by the structural formula

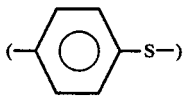

in an amount of more than about 95 mol percent.

5. The sheet-like material as claimed in claim 1 wherein the amount of ingredient which is extracted through chloroform extraction is less than 1.2 wt.% of the entire weight of said sheet-like material prior to said extraction.

6. The sheet-like material as claimed in claim 1 wherein said index of crystallinity is in the range of above 3.0 and below 6.0.

7. The sheet-like material as claimed in claim 1 wherein the melt viscosity of said poly p-phenylene-sulfide is in the range between 2,000 and 100,000 poises at a shear rate of 200 seconds$^{-1}$ at 300° C.

8. The sheet-like material as claimed in claim 7 wherein the melt viscosity of said poly p-phenylenesulfide is in the range between 3,000 and 50,000 poises.

9. The sheet-like material as claimed in claim 1 wherein the non-Newtonian coefficient of said poly p-phenylenesulfide at 300° C. is in the range of about 0.9 to 2.0.

10. A sheet-like material as claimed in claim 1 wherein the melt flow index of said poly p-phenylene sulfide is in the range of about 10 to 130.

11. A sheet-like material as claimed in claim 1 wherein the degree of polymerization of said poly p-phenylenesulfide is about 50 to 1,000.

* * * * *

UNITED STATES PATENT AND TRADEMARK OFFICE
CERTIFICATE OF CORRECTION

PATENT NO. : 4,370,469
DATED : Jan. 25, 1983
INVENTOR(S) : Deguchi et al

It is certified that error appears in the above-identified patent and that said Letters Patent is hereby corrected as shown below:

Column 2, line 11, delete "A" and insert --$\overset{\circ}{\text{A}}$--.

Column 2, line 12, delete "A" and insert --$\overset{\circ}{\text{A}}$--.

Column 3, line 1, delete "," and insert --,--.

Column 9, line 4, delete "(A)" and insert --(Å)--.

Column 9, line 7, delete "A" and insert --$\overset{\circ}{\text{A}}$--.

Column 9, line 34, delete "γ" and insert --$\overset{\circ}{\gamma}$--.

Signed and Sealed this

Twenty-sixth Day of July 1983.

[SEAL]

Attest:

GERALD J. MOSSINGHOFF

Attesting Officer     Commissioner of Patents and Trademarks